(12) United States Patent  
Ives

(10) Patent No.: US 7,821,129 B2
(45) Date of Patent: Oct. 26, 2010

(54) LOW COST HERMETIC CERAMIC MICROCIRCUIT PACKAGE

(75) Inventor: Fred H. Ives, Veradale, WA (US)

(73) Assignee: Agilent Technologies, Inc., Santa Clara, CA (US)

( * ) Notice: Subject to any disclaimer, the term of this patent is extended or adjusted under 35 U.S.C. 154(b) by 226 days.

(21) Appl. No.: 11/007,359

(22) Filed: Dec. 8, 2004

(65) Prior Publication Data

US 2006/0118945 A1    Jun. 8, 2006

(51) Int. Cl.
H01L 23/12    (2006.01)

(52) U.S. Cl. .................. 257/729; 257/772
(58) Field of Classification Search ............... None
See application file for complete search history.

(56) References Cited

U.S. PATENT DOCUMENTS

| 4,791,075 | A | * | 12/1988 | Lin ........................... 29/837 |
| 4,818,821 | A | * | 4/1989 | Wentworth et al. ......... 174/546 |
| 4,895,291 | A | * | 1/1990 | Ozimek et al. .............. 228/121 |
| 4,942,076 | A |  | 7/1990 | Panicker et al. |
| 5,089,881 | A |  | 2/1992 | Panicker et al. |
| 5,138,426 | A | * | 8/1992 | Umeda et al. ............... 257/701 |
| 5,270,491 | A | * | 12/1993 | Carnall et al. ............ 174/50.54 |
| 6,888,239 | B1 | * | 5/2005 | Kim ........................... 257/710 |
| 6,894,592 | B2 | * | 5/2005 | Shen et al. .................... 335/78 |
| 7,057,352 | B2 | * | 6/2006 | Sakaguchi ................ 315/169.1 |
| 7,075,183 | B2 | * | 7/2006 | Soga et al. ................... 257/772 |
| 2002/0100986 | A1 | * | 8/2002 | Soga et al. ................... 257/779 |
| 2003/0214024 | A1 | * | 11/2003 | Ono ............................ 257/686 |
| 2004/0232454 | A1 | * | 11/2004 | Uemura et al. .............. 257/222 |
| 2005/0151599 | A1 | * | 7/2005 | Ido et al. ..................... 333/133 |
| 2009/0096063 | A1 | * | 4/2009 | Terui et al. .................. 257/532 |

FOREIGN PATENT DOCUMENTS

JP    54102969 A    *    8/1979

* cited by examiner

Primary Examiner—Alonzo Chambliss

(57) ABSTRACT

Hermeticity of microcircuit packages is achieved in one embodiment by recognition that water can penetrate the ceramic structure and thus the ceramic structure is sealed and the edges of the ceramic package are metallically bonded to the electronic package. In one embodiment, a clear ceramic dielectric compound is sprayed on the ceramic and then the package is glazed.

24 Claims, 3 Drawing Sheets

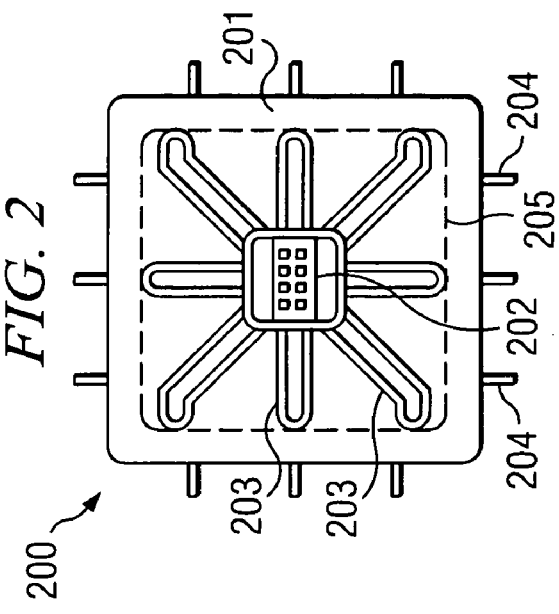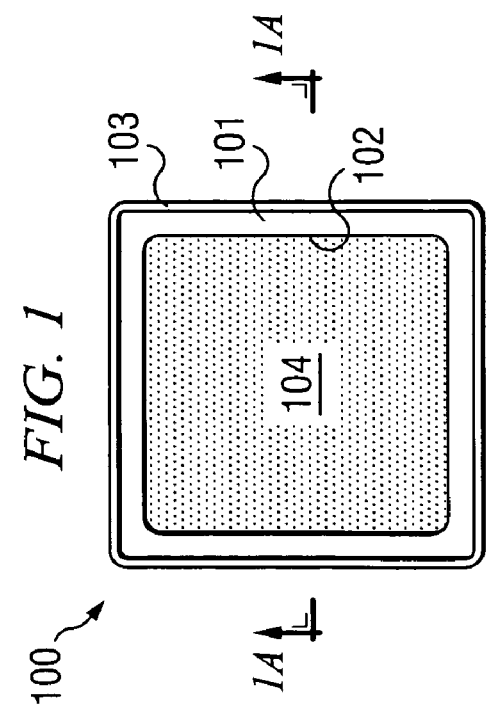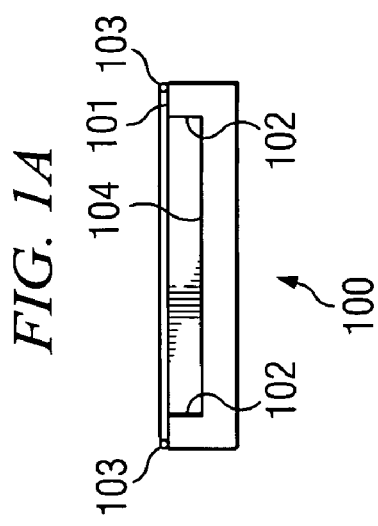

LOW COST HERMETIC CERAMIC MICROCIRCUIT PACKAGE

TECHNICAL FIELD

This invention relates to ceramic microcircuit packages and more particularly to systems and methods for making and using low cost hermetic ceramic microcircuit packages.

BACKGROUND OF THE INVENTION

High frequency ceramic microcircuit packages were introduced in the 1980's, examples of which are shown in U.S. Pat. Nos. 4,942,076 and 5,089,881. Such packages allow fine pitch microcircuit packaging with multi-layer and metal filled vias. The multi-layer ceramic substrate with metal filled vias provided the "water tight" hermeticity of the base of the microcircuit. Hermeticity of the device mounted inside this package was achieved by soldering onto the package a metal wall around the device and then soldering a metal lid to the metal wall. Alternatively, a combination metal lid and sidewall could be soldered into place. Hermeticity in this context is defined as achieving a leak rate less than $1 \times 10E-8$ CC/Second of Helium. The soldered (or brazed) metal sidewall and lid solution is expensive to manufacture due to the fine metal detail needed to manufacture the covering package lid. Precision soldering the covering package lid to the circuit also adds to the cost.

One solution to the cost issue that has been used where mechanical protection is required for the device but hermeticity is not required is to epoxy a low cost ceramic package lid over the device using a dry nitrogen atmosphere. Ceramic packages have been found to allow Gallium Arsenide (GaAs) ICs circuits to fail because water vapor penetrates the package lid (housing) around the circuit. This water vapor has been thought to pass through the epoxy seal but not through the walls of the housing itself.

BRIEF SUMMARY OF THE INVENTION

Hermeticity of microcircuit packages is achieved in one embodiment by recognition that water can penetrate the ceramic structure as well as the epoxy seal. To prevent water vapor from entering a sealed package, the ceramic structure is sealed and the edges of the ceramic package are metallically bonded to the substrate around the device to be protected. In one embodiment, a clear dielectric compound is sprayed on the interior of the ceramic package and then the package is fired to glaze the dielectric compound into the material of the ceramic lid. Solder is added to the edges of the package to form the metallic seal.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which:

FIG. 1A shows a cross-section of the package lid of FIG. 1;

FIG. 1B shows another embodiment of a low cost hermetically sealable package lid.

FIG. 2 shows one embodiment of an electronic circuit substrate to Be coverd by the package lid of FIG. 1.

DETAILED DESCRIPTION OF THE INVENTION

Figure 1:
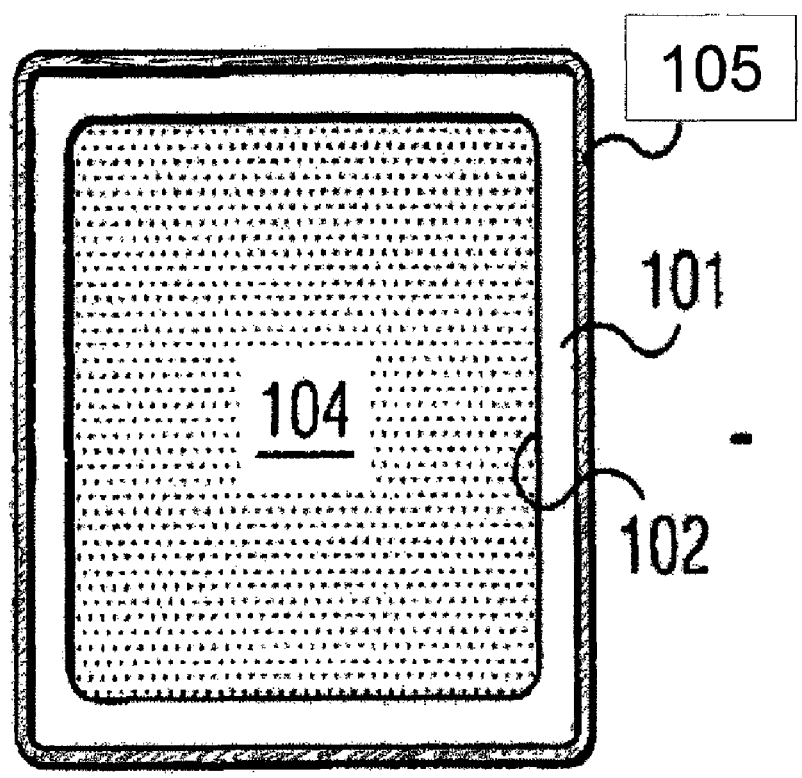
FIG. 1 shows one embodiment of a low cost hermetically sealable package lid.

FIG. 1 shows one embodiment 100 of a low cost hermetically sealable package lid. In this embodiment, package lid 100 is a ceramic housing, or cover, designed to be placed over a microcircuit, such as RF microcircuit 202, shown in FIG. 2.

FIG. 1A shows a cross-section view of package lid 100 taken through section 1A of FIG. 1 showing inside surfaces 102 and 104 which will be sealed. The height of sides 102 can be made to fit over circuit 202 and can be made any height as required. A metallic bonding material, such as, for example, solder bead 103, is shown on edge 101 and this bead could be on the outside edge as shown, or on the inside edge, or could be flat along the full edge.

The inside surface, including surfaces 104 and 102 of package lid 100, in one embodiment, is coated with a ceramic dielectric material which is then fired at a temperature of 1250° C. for one minute. Currently, the dielectric material being used is applied by Max Levy Autograph, Inc., 220 West Roberts Avenue, Philadelphia, Pa.; and is a material proprietary to Max Levy Autograph, Inc. Any glaze of any color could be used and if increased reflectivity is desired the glass could be clear or otherwise made reflective.

A gold binding material 105, shown in FIG. 1B, such as a ceramic gold mixture, is put on (by screening, sputtering, or otherwise) the bottom edges 101 and the package is again fired, this time to a temperature of 850° C. for one minute. The gold/tin solder 103 is put over the gold binding and the package lid is again fired, this time at 320° C. Note that gold/tin solder can be any material provided it will bond with the gold plated (or other) material of electronic circuit substrate 201 (FIG. 2) in a manner to avoid water vapor from penetrating the seal. Since in our example electronic circuit 202 is assumed to be mounted on a gold plated platform, such as platform 201 (FIG. 2), then solder bead 103 (shown best in FIG. 1A) could be gold/tin having a ratio of 80% gold to 20% tin. Alternatively, instead of applying the solder to the package lid, a separate solder preform could be used with a package lid to make the hermetic seal to the package substrate.

Edges 101 of package 100 are then brought into contact with substrate 201 between the broken line and the edge of substrate 201 as shown in FIG. 2. The metal (in this example, gold/tin) is bonded with the gold plating of the substrate at a temperature of 300° C.

One method of accomplishing such bonding is to bring the two pieces (100 and 200) into contact with one another in a carbon holding fixture and then applying electricity to the package. A weight can be used to force ceramic package lid 100 into better contact with substrate 201. The electricity heats the package and solder 103 from the ceramic package bonds with the gold plating of substrate 201. Note that the composition of the solder material on the lid controls the melting point of the seal and can be adjusted as necessary. Soldering, or other bonding, such as laser welding, brazing, welding, etc., of package 100 to substrate 201 should be performed in a dry nitrogen (or other drying) atmosphere. The assembled package should be tested for both gross and fine leakage.

Using this system, the clear seal inside the ceramic package allows internal LED light to be reflected onto the GaAs device, if desired, thereby increasing operating system performance.

The reason for glazing the inside surface of package lid 100 is to prevent moisture from wicking through the ceramic. Until recently it has been thought that the ceramic package lid itself was water tight. In actuality, a typical ceramic package lid is sufficiently grainy so as to allow water molecules to pass through. This realization has led to the glazing of inner surfaces of package lid 100. If desired, the outer surface could be glazed instead, or both inner and outer surface could be glazed.

FIG. 2 shows one embodiment 200 of an electronic device, such as electronic device 202, to be covered by package lid 100. Solder preform 103, as discussed above, could be on the outside edge of package lid 100, as shown, or on the inside edge (not shown), or across the entire edge (not shown). The inner edge of package lid 100 mates with substrate 201 along dotted line 205 thereby covering (protecting) circuit 202 and its various elements 203 from mechanical damage as well as from moisture. Substrate 201 could have terminals 204 for connections to other system components.

Electronic device 200, with package lid 100 soldered in place, then can be added to a printed circuit board or to another substrate, if desired, (such as substrate 301, FIG. 3) using a solder compound requiring less heat, for example 230° C., to control the soldering process. The solder used for such a bonding could be, for example tin/lead.

Figure 3:
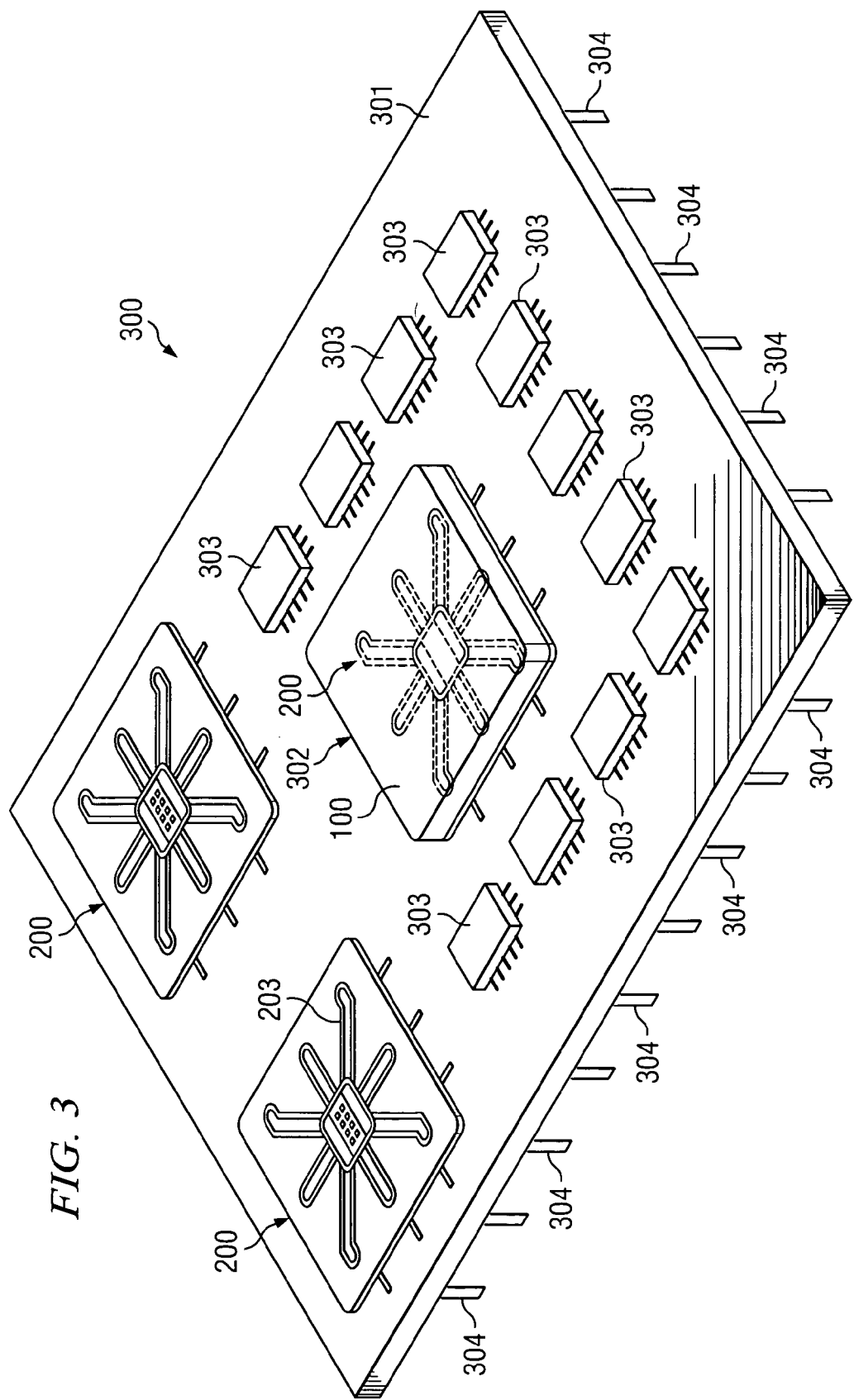
FIG. 3 shows one embodiment of a printed circuit board having thereon.

FIG. 3 shows one embodiment 300 of a printed circuit board or a substrate, such as substrate 301, having several electronic circuits, such as circuits 200, 302, and components, such as components 303, mounted thereon. Components 200 are shown uncovered, while component 302 is essentially component 200 with package lid 100 sealed thereto. Substrate 301 could have terminals 304, or flat planar terminals (not shown) for connection to other system components.

Although the present invention and its advantages have been described in detail, it should be understood that various changes, substitutions and alterations can be made herein without departing from the spirit and scope of the invention as defined by the appended claims. For example, as new epoxy glues become available it is possible that they have increased moisture resistance. Some of these epoxies can then be used to attach the glazed package lid to the package substrate, achieving much better moisture resistance than previously possible. Such a package lid may not be able to achieve hermetically, as defined above, but may be entirely appropriate for electronic circuit protection in some instances. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A hermetically sealed non-metallic package lid comprising:
    an interior surface;
    a metallic binding agent on bottom edges of said package, corresponding to plating material of an electronics package surface:
    a coating provided over said interior surface, said coating operative to prevent moisture from penetrating through the non-metallic package lid and onto said electronics package surface; and
    a metallic bonding agent on the edges of said package lid where said edges contact said electronics package surface, wherein said metallic bonding agent and said coating provide a hermetic seal for said electronic package.

2. The package lid of claim 1 wherein said metallic bonding is heat activated.

3. The package lid of claim 1 wherein said non-metallic package lid is ceramic.

4. The package lid of claim 1 wherein said coating is a ceramic dielectric material.

5. The package lid of claim 1 wherein coating is clear.

6. The package lid of claim 1 wherein said metallic bonding agent is a solder.

7. The package lid of claim 6 wherein said solder is a gold/tin composite.

8. The hermetically sealed non-metallic package lid of claim 1, wherein the metallic binding agent comprises a ceramic.

9. A cover for positioning around components on an RF circuit board, said cover comprising:
    a ceramic housing;
    a coating provided over an interior surface of said ceramic housing, said coating operative to prevent moisture from penetrating through said ceramic housing and onto said RF circuit board;
    means for binding disposed on the bottom edges of said package, corresponding to plating material of an electronics package surface; and
    means for metallically bonding said sealed housing to said circuit board to create a hermetic atmosphere around RF components inside said component.

10. The cover of claim 9 wherein metallically bonding means comprises: a gold/tin solder compound.

11. The cover of claim 9 wherein said coating comprises a dielectric compound bonded to said ceramic housing.

12. The cover of claim 9, wherein the binding means comprises a ceramic.

13. A package for use in sealing an electronic circuit, said circuit mounted on a platform, said package comprising:
    a non-metallic frame;
    a coating provided over an interior surface of said non-metallic frame, said coating operative to prevent moisture from penetrating through said non-metallic frame and onto said electronics circuit, wherein said interior surface defines a surface area large enough to fit over and around said electronics;

means for binding disposed on the bottom edges of said package, corresponding to plating material of an electronics package surface; and a means integral with the edges of said non-metallic frame for bonding said frame to said platform.

14. The package of claim 13 wherein said coating comprises a ceramic dielectric material.

15. The package of claim 13 wherein a metallic bonding material is bonded to said edges of said package.

16. The package of claim 13 wherein said platform is gold plated and wherein said metallic bonding material is gold/tin solder.

17. The package of claim 16 wherein said gold/tin solder melts at a temperature in the range of 300° C.

18. The package of claim 13, wherein the binding means comprises a ceramic.

19. An electronic package, comprising:

a non-metallic package lid configured to fit over an electronic device disposed over a substrate, the non-metallic package lid comprising: an edge; an interior surface; and a coating disposed over the interior surface of the non-metallic package, wherein the coating prevents moisture from penetrating through the non-metallic package lid and onto said electronic device; and a metallic bonding agent disposed over the edge of the non-metallic package lid and adapted to contact the substrate, wherein the coating and the metallic bonding agent provide a hermetic seal for the electronic package.

20. An electronic package as claimed in claim 19, wherein the metallic bonding agent is heat activated.

21. An electronic package as claimed in claim 19 wherein the non-metallic package lid comprises a ceramic material.

22. An electronic package as claimed in claim 19 wherein the coating is a ceramic dielectric material.

23. An electronic package as claimed in claim 19 wherein the coating is clear.

24. An electronic package as claimed in claim 19, wherein the metallic bonding agent comprises a solder.

* * * * *

UNITED STATES PATENT AND TRADEMARK OFFICE
CERTIFICATE OF CORRECTION

| | | |
|---|---|---|
| PATENT NO. | : 7,821,129 B2 | Page 1 of 1 |
| APPLICATION NO. | : 11/007359 | |
| DATED | : October 26, 2010 | |
| INVENTOR(S) | : Fred H. Ives | |

It is certified that error appears in the above-identified patent and that said Letters Patent is hereby corrected as shown below:

In column 4, line 60, in Claim 13, delete "platforn," and insert -- platform, --, therefor.

Signed and Sealed this
Eighth Day of March, 2011

David J. Kappos
*Director of the United States Patent and Trademark Office*